United States Patent

Kumagai et al.

[11] Patent Number: 5,984,692
[45] Date of Patent: Nov. 16, 1999

[54] BOARD STACKING CONNECTOR CHIP AND TAPE CARTRIDGE CONTAINING THE CHIP

[75] Inventors: Yoshimitsu Kumagai; Ryoji Tanaka, both of Kawagoe, Japan

[73] Assignee: Kyoshin Kogyo Co., Ltd., Tokyo, Japan

[21] Appl. No.: 09/121,048

[22] Filed: Jul. 23, 1998

[30] Foreign Application Priority Data

Feb. 6, 1998 [JP] Japan .................................. 10-025637

[51] Int. Cl.⁶ ........................................................ H01R 9/09
[52] U.S. Cl. ................................................. 439/66; 361/803
[58] Field of Search ........................ 439/66, 74; 361/744, 361/772, 773, 774, 790, 803, 785

[56] References Cited

U.S. PATENT DOCUMENTS

| | | | |
|---|---|---|---|
| 4,647,126 | 3/1987 | Sbota, Jr. ................................ | 439/66 |
| 4,673,967 | 6/1987 | Hingrorany .............................. | 361/803 |
| 4,813,129 | 3/1989 | Kanezos ................................... | 439/66 |
| 5,007,872 | 4/1991 | Tang ........................................ | 361/774 |

Primary Examiner—Lincoln Donovan
Assistant Examiner—J. F. Duverne

[57] ABSTRACT

A board stacking connector chip, which is interposed between opposed first and second printed boards, for stacking both the printed boards, comprises an upper joint portion joined to a connection terminal of the first printed board, a pair of side portions which extend downward from terminal portions of the upper joint portion and are opposed to each other, and a pair of lower joint portions which extend by being bent inward transversely from the lower ends of side portions, being opposed to each other, and are joined to a connection terminal of the second printed board, the upper joint portion, paired side portions, and paired lower joint portions being formed into a substantially rectangular shape in section by bending a plate.

8 Claims, 4 Drawing Sheets

BOARD STACKING CONNECTOR CHIP AND TAPE CARTRIDGE CONTAINING THE CHIP

BACKGROUND OF THE INVENTION

1. Field of the Invention

The present invention relates to a board stacking connector chip, which is interposed between two opposed printed boards, for stacking the printed boards.

2. Description of Related Art

Electronic equipment such as personal computers and telephone sets incorporates a large number of electronic components. For this reason, these electronic parts are generally contained in an equipment housing by being mounted dividedly on a plurality of printed boards. In order to achieve space saving and easy assembly, when a plurality of printed boards on which electronic components are mounted are contained in a housing, they are often contained in such a manner that the boards are arranged so as to be opposed to each other.

To arrange two printed boards so as to be opposed to each other, a system is possible in which connectors are interposed between the printed boards. Specifically, male connectors and female connectors are fixed at predetermined positions of the opposed surfaces of the respective two printed boards, and these connectors are fitted to each other, whereby the two printed boards are arranged oppositely. If each of the connectors is connected electrically to a conductor pattern on the printed board, the electrical conduction between the two printed boards can be achieved simultaneously.

As another system for oppositely arranging two printed boards, a system in which pins are interposed between the boards is also possible. With this system, the base of a pin is mounted on one of two opposed printed boards, and an insertion hole through which the tip end of the pin is inserted is formed on the other thereof. The pin is inserted through this insertion hole, and the tip end thereof and the periphery of insertion hole are joined by soldering. Thus, by interposing the pins between the boards as spacers, the two printed boards can be arranged oppositely. If the pin is a conductor, the electrical conduction between the conductor patterns of the two printed boards can be achieved simultaneously via the pin.

In recent years, the demand for high-density mounting of electronic components on a printed board has increased with the advance of the downsizing of electronic component and the improvement in component mounting technology. To meet this demand, as the electronic component mounting method, the surface mounting system has been used in place of the conventional insertion mounting system. The conventional insertion mounting system is a system in which the components are fixed by inserting the lead wires of electronic components through the holes in the printed board. In contrast, the surface mounting system is a system in which the electronic components such as chip components are directly mounted and soldered to the surfaces of conductor patterns on the printed board, such as FP (Flat Package) and SOP (Small Outline Package).

The surface mounting system, in which the aforesaid electronic components are soldered to the conductor patterns on the printed board while being brought into direct contact, has an advantage that the electronic component need not have a lead wire for mounting on the board. Moreover, the printed board need not be formed with a hole through which the lead wire passes, so that this system also has an advantage that a process of drilling holes in the board can be omitted. Further, since the electronic components can be mounted directly onto the conductor patterns on the printed board, the height of the electronic component from the board surface can be decreased, so that this system has an advantage that the clearance between the opposed printed boards can be reduced. Therefore, the space occupied by the printed boards can be saved.

However, in the conventional system in which two boards are arranged oppositely by interposing male connectors and female connectors between the printed boards, the clearance between the boards is determined by the heights of these connectors. Therefore, the clearance between the opposed printed boards cannot be decreased, so that the above-described advantage peculiar to the surface mounting method cannot be utilized.

Meanwhile, in the conventional system in which pins are interposed between the opposed printed boards, holes for inserting lead wires must be formed in one of the boards, so that an excess drilling process is required. For this reason, the advantage peculiar to the surface mounting method not requiring excess working on the printed board cannot be utilized. Also, stresses are concentrated at the solder joint portion of lead wire and conductor pattern by a deformation (for example, deflection of board) of printed board occurring with the passage of time, so that the solder joint portion is liable to be separated.

SUMMARY OF THE INVENTION

An object of the present invention is to provide a board stacking connector chip which can arrange two printed boards oppositely with a small clearance.

Another object of the present invention is to provide a board stacking connector chip which can be joined securely to both the boards even if the thickness of solder paste applied to a conductor pattern of the printed board is nonuniform, and which can be joined securely to both the boards even if the clearance between the opposed two printed boards is not strictly constant due to board deflection or the like.

Still another object of the present invention is to provide a board stacking connector chip having a joint surface which can be soldered easily to the printed board.

The connector chip in accordance with the present invention comprises an upper joint portion joined to a connection terminal of a first printed board, a pair of side portions which extend downward from terminal portions of the upper joint portion and are opposed to each other, and a pair of lower joint portions which extend by being bent inward transversely from the lower ends of side portions, being opposed to each other, and are joined to a connection terminal of a second printed board, and is characterized in that the upper joint portion, paired side portions, and paired lower joint portions are formed into a substantially rectangular shape in section by bending a plate.

In arranging the printed boards oppositely, it is unnecessary, unlike the prior art, to install male connectors and female connectors between the opposed printed boards to fit these connectors to each other, so that the clearance between the printed boards can be decreased, and the space containing boards can be saved by utilizing the merit of the surface mounting method to the maximum.

Also, it is unnecessary to insert pins mounted on one board into insertion holes in the other board and solder them by the dip soldering process. Therefore, an excess process such as drilling in the board is not needed, so that the advantage peculiar to the surface mounting method of simplified electronic component mounting process can be utilized.

Further, since the connector chip has a substantially rectangular shape in section, the area occupied by connector chip on the printed board can be decreased, which contributes to the high-density mounting of electronic components on the board.

Still further, since a butt portion of plate is formed at the lower joint portion of the connector, the butt portion, which is easily deformed, can be fixed to the conductor pattern of the printed board by soldering, so that an unnecessary deformation of connector chip after being mounted on the board can be prevented.

Preferably, the connector chip is characterized in that each of the side portions has a bent portion capable of being extended and contracted vertically with respect to the board to be joined.

According to this preferred configuration, a plurality of connector chips can be joined securely between the conductor patterns of boards even if the amount of solder paste applied to the conductor pattern of the printed board is nonuniform. Also, a plurality of connector chips can be joined securely between the connector patterns of boards even if the clearance between the opposed two printed boards is not strictly constant due to board deflection or the like.

Further, when the clearance between the two printed boards changes with the passage of time, the soldered joint portion of connector chip is prevented from being separated to the utmost.

Preferably, the connector chip is characterized in that a butt portion of the plate is inclined to the joint portion side toward the end.

According to this configuration, the solder intruding into a gap between the butt-side joint portion and the conductor pattern to which the joint portion is joined solidifies, so that the connector chip can be joined to the printed board more firmly.

Preferably, the connector chip is characterized in that either one of the upper and lower joint portions has a wider surface.

According to this configuration, when the connector chip is removed from the containing portion of a tape cartridge and mounted on the printed board, the attracting pad of handling equipment can attract the wider surface firmly, so that the connector chip does not drop from the handling equipment during the mounting work.

The foregoing and other objects, features, and advantages of the present invention will be more apparent from the following detailed description.

DETAILED DESCRIPTION OF THE PREFERRED EMBODIMENTS

A board stacking connector chip in accordance with one embodiment of the present invention will be described below with reference to the accompanying drawings.

Figure 1:
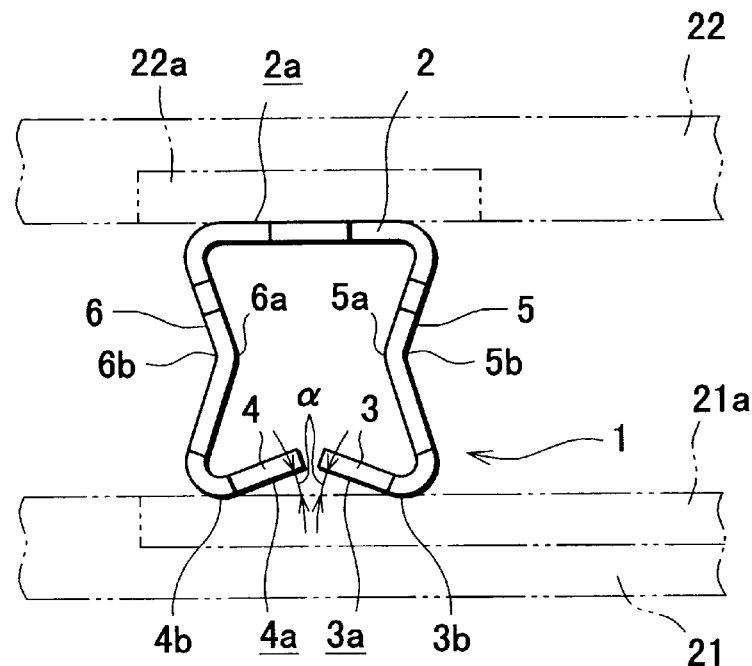
FIG. 1 is a front view of a connector chip 1 in accordance with one embodiment of the present invention.

As shown in FIG. 1, a connector chip 1 in accordance with one embodiment of the present invention is formed of a copper alloy plate the surface of which is plated so as to be suitable for soldering, and the end section thereof has a substantially rectangular shape by bending the plate. The connector chip 1 comprises an upper joint portion 2 joined to a connection terminal of a first printed board, a pair of side portions 5 and 6 which extend downward from terminal portions of the upper joint portion and are opposed to each other, and a pair of lower joint portions 3 and 4 which extend by being bent inward transversely from the lower ends of side portions, being opposed to each other, and are joined to a connection terminal of a second printed board. The board support portions 5 and 6 have bent portions 5a and 6a, respectively, which are capable of being extended and contracted vertically with respect to the printed boards to be joined.

Figure 2:
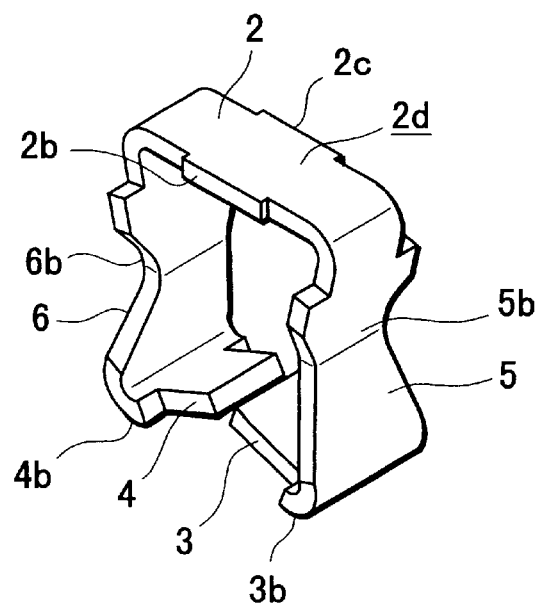
FIG. 2 is a perspective view of a connector chip 1 in accordance with one embodiment of the present invention.

On the outside surface of the upper joint portion 2 is formed a joint surface 2a for joining the connector chip 1 to a conductor pattern 22a of an upper printed board 22. The joint surface 2a is formed substantially flush so that the connector chip 1 can be easily joined to the conductor pattern 22a of the upper printed board 22. In the center of the upper joint portion 2, as shown in FIG. 2, protruding portions 2b and 2c which protrude from both side faces of the upper joint portion 2 to the side are formed. The joint surface of the portion where the protruding portions 2b and 2c are formed is wider than the joint surface of other portions, by which a wider surface 2d for attracting the connector chip 1 is formed.

As shown in FIGS. 1 and 2, the lower joint portions 3 and 4 are configured so that the ends of plate extend from respective lower ends (base portion) of the board support portions 5 and 6 so as to approach each other. Also, the ends of the lower joint portions 3 and 4 are separated slightly, forming a butt portion of plate. The lower joint portion 3, 4 is inclined upward from the base portion toward the end (butt portion of plate). This inclination angle (an angle between the joint portion 3, 4 and a conductor pattern 21a) α is, as shown in FIG. 1, an angle at which the solder between joint surfaces 3a and 4a formed outside the lower joint portions 3 and 4, respectively, and the conductor pattern 21a solidifies and the connector chip 1 is firmly fixed to the conductor pattern 21a when the lower joint portions 3 and 4 of the connector chip 1 are mounted onto the conductor pattern 21a of the lower printed board 21. Preferably, this angle α should be about 5 to 15 degrees.

If the aforesaid solder solidifies so that the connector chip 1 can be joined firmly to the conductor pattern 21a, the ends of the lower joint portions 3 and 4 may be separated to some degree.

As shown in FIG. 2, the base portion of the lower joint portion 3, 4, which is wider than the vicinity of the butt portion, forms an abutting portion 3b, 4b abutting on the conductor pattern 21a of the lower printed board 21 as shown in FIG. 1. When the lower joint portions 3 and 4 are mounted on the conductor pattern 21a of the board 21, the connector chip 1 is supported stably on the conductor pattern 21a by the abutting portions 3b and 4b.

The board support portion 5, 6 has a plate thickness of a degree such that it is not bent easily even when the upper printed board 22 is mounted on the connector chip 1. Also, the board support portion 5, 6 has a constricted portion 5b, 6b formed in the center thereof as shown in FIGS. 1 and 2. That is, the board support portion 5, 6 is bent inward at this constricted portion 5b, 6b so that the side portions 5 and 6 approach each other. The constriction degree and bending degree of the constricted portion 5b, 6b are such that when a plurality of connector chips 1 are joined to between the conductor patterns to which solder paste of nonuniform amount is applied, each constricted portion is bent (deformed) according to the clearance between the solder paste surfaces, by which all connector chips 1 can be joined securely to the conductor pattern 22a of the upper printed board 22. More preferably, the constricted portion 5b, 6b should be constricted and bent to a degree such that the bent portion 5a, 6a can be deformed even if the printed board is deflected by thermal effect or the like after the connector chip is joined, and thereby the clearance between the boards is somewhat changed. By providing such constricted portions 5b and 6b, the occurrence of an excessive stress concentration at the solder joint portion is avoided, and thereby the solder separation can be prevented.

Figure 3:
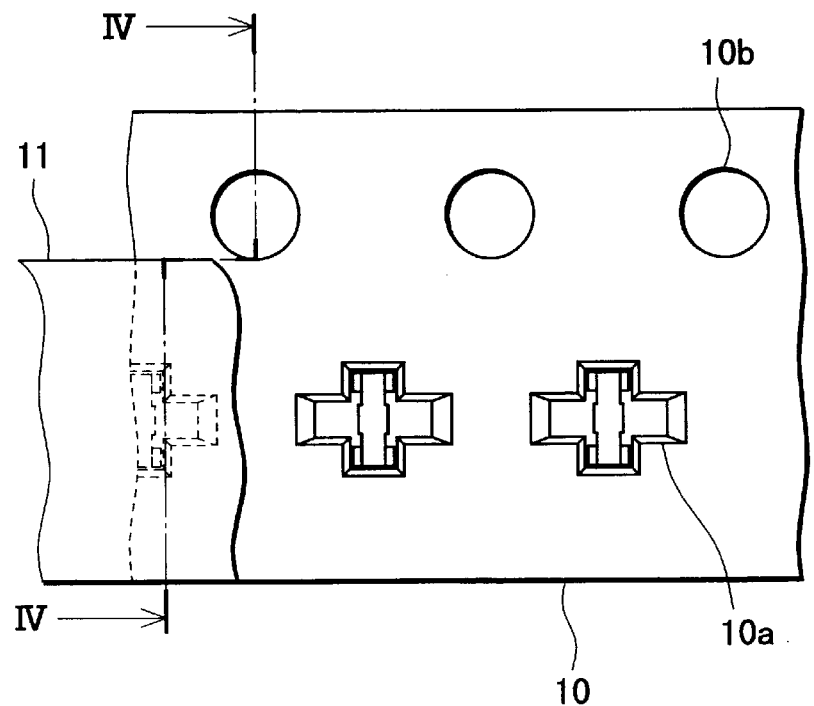
FIG. 3 is a view showing a taping connector chip in accordance with one embodiment of the present invention.
Figure 4:
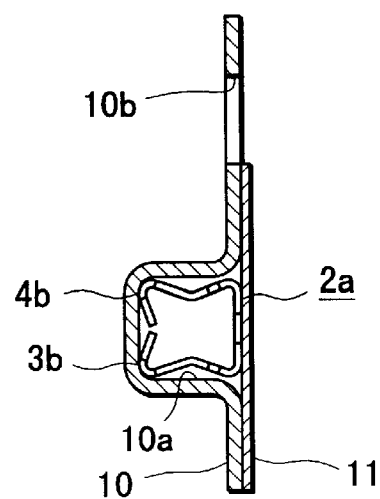
FIG. 4 is a sectional view taken along the line IV—IV of FIG. 3, showing a taping connector chip in accordance with one embodiment of the present invention.

When such connector chips 1 are actually mounted on the circuit board by using a surface mounting machine, many connector chips 1 are contained at equal intervals in a tape cartridge, that is, an embossed carrier tape (mount tape) 10 for ease of handling as shown in FIG. 3. More specifically, this embossed carrier tape 10 is formed with cross-shaped concave portions 10a at predetermined intervals. The connector chip 1 is contained in the concave portion 10a in such a manner that the lengthwise direction thereof is perpendicular to the lengthwise direction of the embossed carrier tape 10, and as shown in FIG. 4, the abutting portions 3b and 4b of the connector chip 1 abut on the bottom of the concave portion 10a.

Also, on the top surface of the embossed carrier tape 10 is bonded an affixed tape 11 to prevent the connector chip 1 from dropping. Since the joint surface 2a of the upper joint portion 2 of the connector chip 1 is substantially flush with the top surface of the embossed carrier tape 10, the affixed tape 11 is bonded to the joint surface 2a of the connector chip 1, so that the connector chip 1 is contained securely in the concave portion 10a.

Figure 5:
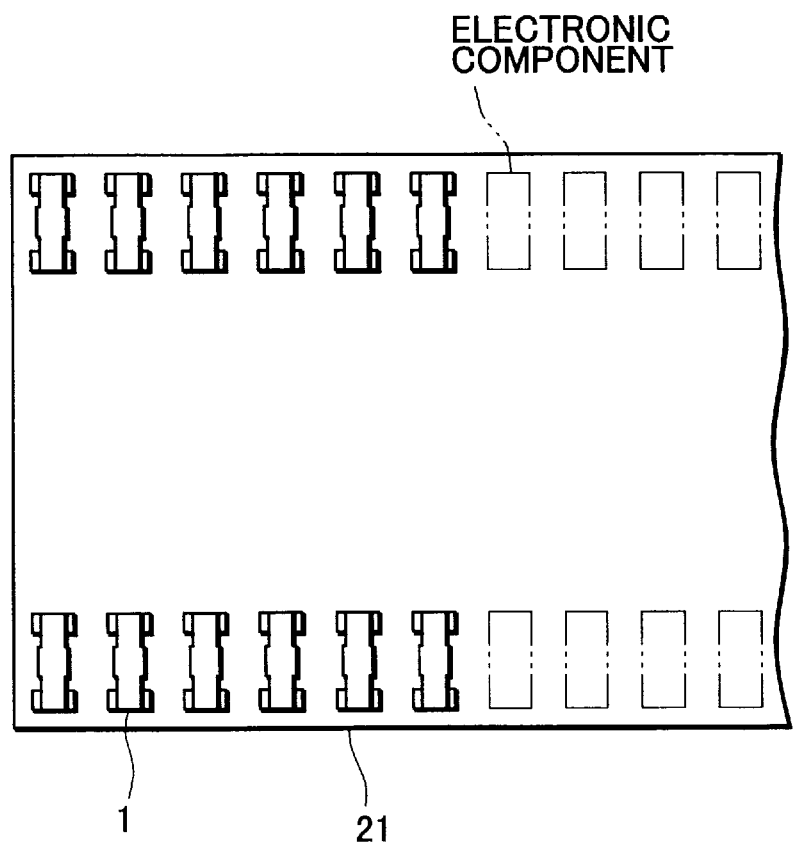
FIG. 5 is a view showing a state in which connector chips 1 in accordance with one embodiment of the present invention are mounted on a lower printed board 21, viewed from the upside.

In order to mount the connector chips 1 on the lower printed board 21 shown in FIG. 5, the embossed carrier tape 10 is mounted on an electronic component supply section (not shown) of a chip mounter, a feed mechanism of the electronic component supply section is meshed with feed round holes 10b of the embossed carrier tape 10 shown in FIG. 3, and the embossed carrier tape 10 is fed with a predetermined pitch. At the same time, the connector chips 1 contained in the concave portions 10a of the embossed carrier tape 10 are removed one by one while the affixed tape 11 covering the embossed carrier tape 10 is peeled off. This removal work is performed by attracting the joint surface 2a of the upper joint portion 2 of the connector chip 1 by an attracting pad (not shown) of handling equipment.

Since the wider surface 2d is formed on the joint surface 2a, the attracting area of the connector chip 1 can be made large, by which the connector chip 1 can be held securely by the handling equipment. Therefore, when the connector chip 1 is mounted on the lower printed board 21, the connector chip 1 can be prevented from dropping from the attracting pad.

Figure 6:
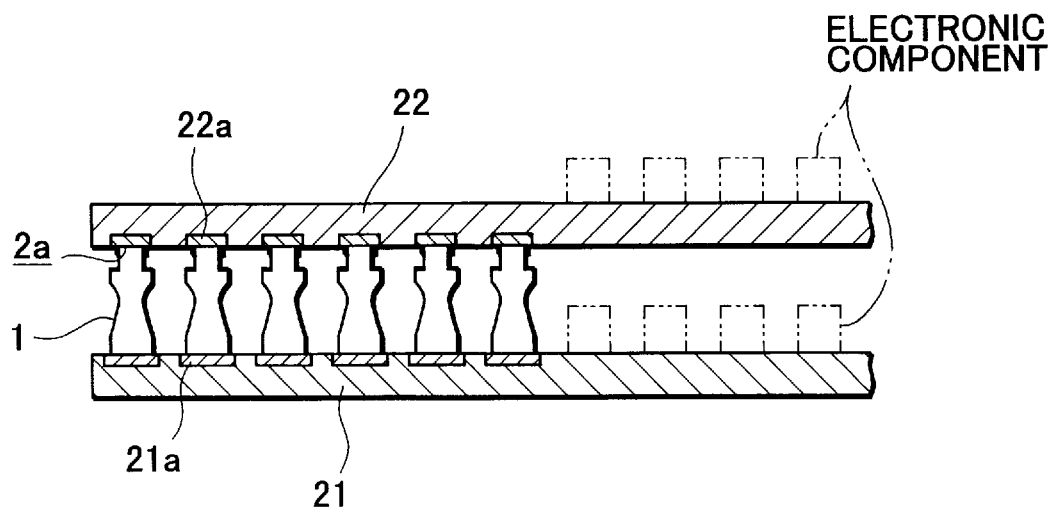
FIG. 6 is a view showing a state in which connector chips 1 in accordance with one embodiment of the present invention are interposed between printer boards 21 and 22, viewed from the side.

Next, the removed connector chips 1 are mounted at predetermined positions on the conductor pattern 21a of the lower printed board 21. The mounting position is not limited to the position shown in FIG. 5. Any position is allowable only if the lower printed board 21 and the upper printed board 22 can be arranged oppositely with a fixed clearance, and as shown in FIG. 6, the connector chips 1 can be interposed between the conductor patterns 21a and 22a of the boards 21 and 22. A plurality of positions are possible which are separated a fixed distance, for example, on a power supply conductor pattern (not shown) and signal transmitting conductor pattern (not shown) on the boards 21 and 22. At these mounting positions, solder containing flux, that is, solder paste has been applied beforehand.

Since the abutting portions 3b and 4b of the connector chip 1 are wider, when the connector chip 1 is mounted on the conductor pattern 21a of the lower board 21, the connector chip 1 can securely be mounted on the conductor pattern 21a without inadvertent falling.

After all the electronic components and connector chips 1 are mounted to the lower printed board 21 using the chip mounter, the lower printed board 21 is heated in a heating furnace to remelt the solder.

By this heating process, the solder intrudes into a gap between the joint surface 3a, 4a of the lower joint portion 3, 4 of the connector chip 1 and the conductor pattern 21a of the lower board 21. Thereafter, the solder solidifies so that the connector chip 1 can be joined firmly onto the conductor pattern 21a.

The periphery of the butt joint formed at the lower joint portion 3, 4 of the connector chip 1 is fixed onto the conductor pattern by solder, so that an unnecessary deformation of the connector chip 1 caused by the relative shift of butt portion can be prevented.

Thus, the electronic components and connector chips 1 can be mounted to the lower board 21 rapidly and securely by the surface mounting method and reflow soldering process. Also, special working such as drilling in the board 21 is not needed.

Next, the upper printed board 22 is placed on the connector chip 1 mounted on the lower board 21. On the top surface of the upper printed board 22, necessary electronic components (not shown) have been mounted beforehand by the aforesaid surface mounting method and reflow soldering process.

Figure 7:
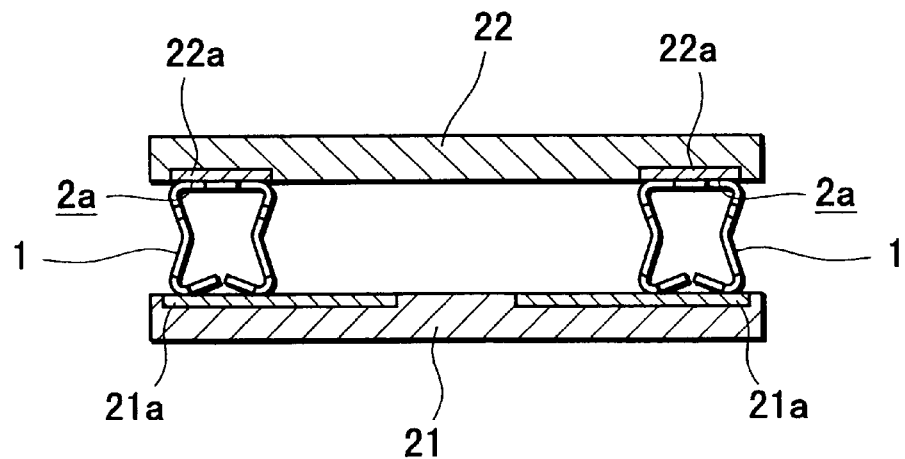
FIG. 7 is a view showing a state in which connector chips 1 in accordance with one embodiment of the present invention are interposed between printer boards 21 and 22, viewed in the lengthwise direction of the board.

In order to perform this placing work, as shown in FIGS. 6 and 7, the upper joint surface 2a of the connector chip 1 mounted to the lower printed board 21 is made to abut on a predetermined position of the conductor pattern 22a formed on the lower surface of the upper printed board 22. At this predetermined position as well, solder containing flux, that is, solder paste has been applied beforehand.

The amount of paste applied to the conductor pattern 22a at the portion abutting on each connector chip 1 is sometimes nonuniform. If the upper printed board 22 is placed on the connector chips 1 in such a state, not all the connector chips 1 abut on the conductor pattern of the upper board 22, and there are formed gaps between some connector chips 1 and the conductor pattern. If the upper board 22 is heated in a heating furnace in this state, poorly soldered locations are produced between the connector chip 1 and the conductor pattern 22a of the upper board 22. However, since the bent portions 5a and 6a are formed at the board support portions 5 and 6 of the connector chip 1, respectively, if the upper board 22 is pushed down with a certain pushing force after the upper board 22 is placed on the connector chips 1, the bent portions 5a and 6a of each connector chip 1 are deformed appropriately, so that the upper joint surfaces 2a of all the connector chips 1 can be brought into contact with the conductor pattern 22a of the upper board 22. As a result, as described above, soldering can be prevented from being performed in a state in which there are gaps between some connector chips 1 and the conductor pattern.

The bent portions 5a and 6a and the constricted portions 5b and 6b may be formed so that the upper joint surfaces 2a of all the connector chips 1 are brought into contact with the conductor pattern 22a of the upper board 22 by the gravity of the upper printed board 22. Thereby, the process for pushing the upper printed board 22 down can be omitted.

Figure 8:
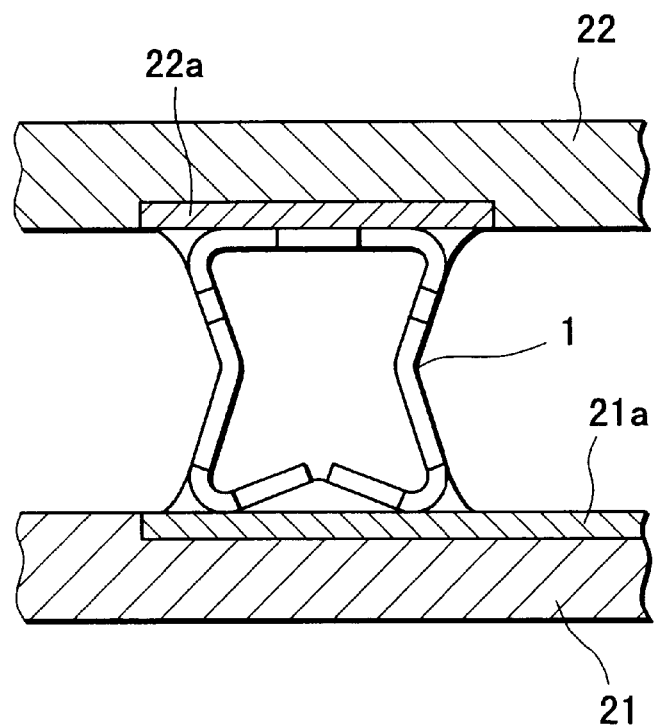
FIG. 8 is an enlarged view showing a state in which a connector chip 1 in accordance with one embodiment of the present invention is joined by soldering between printed boards 21 and 22.

Next, the printed boards 21 and 22, which have been arranged oppositely as described above, are reheated in a heating furnace to remelt solder on the upper board 22, whereby solder is joined to the upper joint surface 2a of the connector chip 1. Since the upper joint surfaces 2a of all the connector chips 1 are brought into contact with the conductor pattern 22a of the upper board 22 as described above, all the connector chips 1 can be joined securely to the conductor pattern 22a of the upper printed board 22 by the melting and solidifying of solder as shown in FIG. 8.

Next, the two printed boards 21 and 22, which have been arranged oppositely as described above, are contained in an electronic equipment housing while being oriented arbitrarily.

Thus, the boards 21 and 22 can be arranged oppositely in a state in which the clearance between the boards is made very small by the connector chips 1 in accordance with the above embodiment. As a result, the space for the region containing printed boards can be saved.

After the boards between which the connector chips 1 in accordance with the above embodiment are interposed is contained in the electronic equipment housing, the clearance between the printed boards sometimes changes by some deformation of printed board caused by thermal effect. Even in such a case, by the deformation of the bent portions 5a and 6a of the connector chip 1, the stress concentration to the solder joint portion can be avoided, so that the separation of solder can be prevented.

Unlike the above embodiment, the plate may be made of any material which is easy to bend and highly conductive.

Also, the butt portion of plate may be formed at the upper joint portion 2 of the connector chip 1.

Further, the bent portions may be formed so as to be bent outward from the board support portion. Alternatively, one bent portion may be formed so as to be bent outward from the board support portion, and the other bent portion may be formed so as to be bent inward from the board support portion.

Still further, the formation of the constricted portions 5b and 6b at the bent portions 5a and 6a is not necessarily needed, but the formation of the constricted portions 5b and 6b has an effect that the connector chip can be deformed more easily.

Also, the upper joint portion 2 may be bent inward so that the central portion of the upper joint portion 2 is directed to the lower joint portions 3 and 4. Thereby, only both ends of the upper joint portion 2 abuts on the conductor pattern of the upper printed board 22, and solder intrudes into a gap formed in the central portion of the upper joint portion 2. By the solidification of this solder, the connector chip 1 is joined to the upper printed board 22 more firmly.

Needless to say, not only the connector chips in accordance with the present invention are interposed between two printed boards as described in the above embodiment, but also they can be interposed between a plurality of printed boards to assemble a printed board of multilayer structure.

Also, although the conductor pattern to which the connector chip 1 in accordance with the present invention is joined may be any conductor pattern on the board, it is preferably a land near a through hole. By joining the connector chips 1 to the land, the boards can be stacked more firmly.

Further, the connector chip 1 can be interposed between the printed boards as a simple spacer without electrical connection. In this case, the material of the connector chip 1 is not necessarily conductive. Needless to say, the pattern to which the connector chip 1 is joined may be a simple dummy pattern, not a conductive pattern.

Although a specific mode of the present invention has been shown and explained in the above description, it is obvious that various modifications can be made without departing from the spirit and scope of the present invention. Therefore, the present invention is not limited to the specific embodiment thereof except as defined in the appended claims.

What is claimed is:

1. A board stacking connector chip, which is interposed between opposed first and second printed boards, for stacking both the printed boards, comprising an upper joint portion joined to a connection terminal of said first printed board;

a pair of side portions which extend downward from terminal portions of said upper joint portion and are opposed to each other; and a pair of lower joint portions which extend by being bent inward transversely from the lower ends of side portions, being opposed to each other, and are joined to a connection terminal of said second printed board, said upper joint portion, paired side portions, and paired lower joint portions being formed into a substantially rectangular shape in section by bending a plate.

2. A board stacking connector chip according to claim 1, wherein each of said side portions has a bent portion capable of being extended and contracted vertically with respect to the board to be joined.

3. A board stacking connector chip according to claim 1, wherein a butt portion of said plate is inclined to the joint portion side toward the end.

4. A board stacking connector chip according to claim 1, wherein either one of said upper and lower joint portions has a wider surface.

5. A cartridge tape containing board stacking connector chips, in which concave portions for containing a connector chip according to claim 1 are provided at predetermined intervals, and an affixed tape covers the opening of said concave portion to prevent the connector chip from dropping.

6. A cartridge tape containing board stacking connector chips, in which concave portions for containing a connector chip according to claim 2 are provided at predetermined intervals, and an affixed tape covers the opening of said concave portion to prevent the connector chip from dropping.

7. A cartridge tape containing board stacking connector chips, in which concave portions for containing a connector chip according to claim 3 are provided at predetermined intervals, and an affixed tape covers the opening of said concave portion to prevent the connector chip from dropping.

8. A cartridge tape containing board stacking connector chips, in which concave portions for containing a connector chip according to claim 4 are provided at predetermined intervals, and an affixed tape covers the opening of said concave portion to prevent the connector chip from dropping.

* * * * *